United States Patent
Bosselmann et al.

[19]

[11] Patent Number: 5,963,026
[45] Date of Patent: Oct. 5, 1999

[54] METHOD AND DEVICE FOR THE MEASUREMENT OF ELECTRIC CURRENTS IN AT LEAST TWO MEASURING RANGES

[75] Inventors: Thomas Bosselmann; Hartmut Bartelt, both of Erlangen, Germany

[73] Assignee: Siemens Aktiengesellschaft, München, Germany

[21] Appl. No.: 08/776,687

[22] PCT Filed: Aug. 16, 1995

[86] PCT No.: PCT/DE95/01079

§ 371 Date: Feb. 18, 1997

§ 102(e) Date: Feb. 18, 1997

[87] PCT Pub. No.: WO96/06359

PCT Pub. Date: Feb. 29, 1996

[30] Foreign Application Priority Data

Aug. 23, 1994 [DE] Germany ............... 44 29 909
Sep. 5, 1994 [DE] Germany ............... 44 31 615

[51] Int. Cl.⁶ .................. G01R 33/02; G01R 31/00; G01R 15/24

[52] U.S. Cl. ................... 324/96; 324/244.1; 250/225; 356/364

[58] Field of Search ................... 324/96, 117 R, 324/244.1, 750–753; 250/227.17, 227.24, 225; 356/345, 351, 368, 364; 385/12; 359/280–283

[56] References Cited

U.S. PATENT DOCUMENTS

| | | | |
|---|---|---|---|
| 4,542,338 | 9/1985 | Arditty et al. | 324/117 R |
| 4,947,107 | 8/1990 | Doerfler et al. | 324/96 |
| 5,051,577 | 9/1991 | Lutz et al. | 250/227.17 |

FOREIGN PATENT DOCUMENTS

| | | |
|---|---|---|
| 0 088 419 A1 | 9/1983 | European Pat. Off. . |
| 0 210 716 A1 | 2/1987 | European Pat. Off. . |
| 0 356 670 A1 | 3/1990 | European Pat. Off. . |
| 0 477 415 A1 | 4/1992 | European Pat. Off. . |
| 2 485 204 | 12/1981 | France . |
| 2 130 047 | 12/1972 | Germany . |
| 22 61 151 | 6/1974 | Germany . |
| 24 45 369 | 11/1975 | Germany . |
| 24 42 494 | 4/1976 | Germany . |
| 28 35 794 | 2/1980 | Germany . |
| 30 19 030 | 12/1980 | Germany . |
| 31 16 149 A1 | 11/1982 | Germany . |
| 31 41 325 A1 | 4/1983 | Germany . |
| 33 26 736 C2 | 10/1986 | Germany . |
| 38 29 103 A1 | 3/1990 | Germany . |
| 89 08 763 U | 1/1991 | Germany . |
| 89 08 765 U | 1/1991 | Germany . |
| 43 04 761 A1 | 8/1994 | Germany . |
| 59-37461 | 2/1984 | Japan . |
| 671 638 A5 | 9/1989 | Switzerland . |

OTHER PUBLICATIONS

Chatrefou et al., "A Great Step In The Industrialization of Optical Measuring Reducers," International Conference of Large High Voltage Electric Systems, CIGRE 1988, pp. 1–10.

Bush, S. et al., "Dual–channel Faraday–effect current sensor capable of simultanoues measurement of two independent currents," *Optical Society of America*, Jun. 15, 1991, vol. 16, No. 12, 955–957.

Primary Examiner—Jay Patidar
Attorney, Agent, or Firm—Kenyon & Kenyon

[57] ABSTRACT

Two Faraday elements connected via optical connection means are assigned to a conductor. The Faraday rotation of the linearly polarized measuring light that has traversed the first Faraday element only is used as the measure of a current in a first measuring range. The Faraday rotation of the linearly polarized measuring light that has traversed both Faraday elements is used as the measure of a current in a second measuring range.

10 Claims, 10 Drawing Sheets

METHOD AND DEVICE FOR THE MEASUREMENT OF ELECTRIC CURRENTS IN AT LEAST TWO MEASURING RANGES

BACKGROUND OF THE INVENTION

The invention concerns a method and device for the measurement of currents in at least two measuring ranges in a conductor.

Optical measurement devices are known for measuring an electric current in a conductor using the Faraday effect, also referred to as magneto-optical current converters. The Faraday effect is the rotation of the polarization plane of linearly polarized light caused by a magnetic field. The rotation angle is proportional to the line integral over the magnetic field along the path traveled by light with the Verdet constant as the proportionality constant. The Verdet constant in general depends on the material, temperature, and wavelength. A Faraday element made of an optically transparent material, such as glass, for example, is arranged near the conductor to measure the current. The magnetic field generated by the current causes the plane of polarization of the linearly polarized light emitted by the Faraday element to rotate by an angle that can be analyzed as a measuring signal. In general, the Faraday element surrounds the conductor, so that the light used for measurement travels around the conductor in a basically closed path. The absolute value of the rotation angle in this case is directly proportional, with a good approximation, to the amplitude of the current to be measured. The Faraday element can be designed as a solid glass ring around the conductor, through which the light passes once only, or it can also surround the conductor in the form of a measuring coil made of a light-conducting monomode fiber (fiber coil). In a solid Faraday element, the measuring range of the current converter is adjusted by choosing the appropriate material; smaller Verdet constants are used for larger currents than those used for smaller currents. In the case of a measuring coil, the measuring range of the current converter can also be adjusted via the number of spires in the coil, since the Faraday rotation angle is also proportional to the number of spires, i.e., the number of turns of the light around the conductor. A current range over which the Faraday angle is a unique function of the current is selected as the measuring range. Since techically no distinction can be made between two polarization states of the measuring light that are antiparallel to one another, i.e., rotated by an angle Π in relation to one another, the measuring range of the magneto-optical current converter corresponds to a rotation angle interval with a maximum length of Π/2.

In a magneto-optical current converter known from European Patent B-0,088,419, two Faraday glass rings are arranged in parallel around a common conductor. Both glass rings are made of Faraday materials with different measurement sensitivity and therefore different current measuring ranges. Each Faraday glass ring has a transmitter unit for transmitting linearly polarized measuring light into the glass ring, a Rochon prism, a Wollaston prism or another polarizing beam splitter as an analyzer to split the measuring light rotated after passing through the respective glass ring into two sub-beams with different polarization planes, photodiodes for converting the sub-beam signals of each of the two Faraday glass rings into electrical signals, as well as an analyzer unit to calculate the measurement signal for the corresponding Faraday rotation angle. The two measurement signals of the two Faraday glass rings are supplied to an OR gate, which provides a maximum signal of the two measurement signals. A larger measuring range can be covered with this maximum signal. Different measuring ranges of the two glass rings can also be achieved even using the same glass material for both glass rings, by using measuring light of different wavelengths. The wavelength-dependence of the Faraday rotation is made use of in this case.

For today's measuring technology, current converters for measuring and counting applications should be able to measure nominal currents in a predefined measuring range of up to 2000 A, for example, with a high measuring accuracy of typically between approximately 0.1% and approximately 0.5% and, for protection purposes, overcurrents in a measuring range of 10x to 30x, for example, the nominal current with a lower measuring accuracy of between approximately 5% and approximately 10%.

From "International Conference of Large High-Voltage Electric Systems," CIGRE, Paris, Aug. 28–Sep. 3, 1988, Conference Proceedings, T. Pref. Subj. 1, Vol. 34, Book 15, pp. 1–10, an optical fiber arrangement is known with a first magneto-optical current converter for measuring nominal currents in a measuring range of between 0.1x and 1x a predefined maximum nominal current with a measuring accuracy of 0.2% and with a second magneto-optical current converter for measuring overcurrents in a measuring range of between 0.1x and 20x the maximum nominal current with a measuring accuracy of 5%. The first current converter for measuring nominal currents is of the reflection type and comprises an optical fiber surrounding the conductor in the form of a measuring coil with N spires. Linearly polarized light from a light source is injected into the fiber through a beam splitter, traverses the measuring coil, is reflected back from a mirror in the fiber and traverses the coil for the second time in the reverse direction. Due to the non-reciprocity of the Faraday effect, the rotation angle is doubled. Due to the reciprocity of the intrinsic circular birefringence of the fiber material, the undesirable, in particular temperature-dependent, effects of the circular birefringence are eliminated. After traversing the measuring coil twice, the light is supplied to a Wollaston prism through the beam splitter, and split into two sub-beams polarized perpendicularly to one another, each of which is supplied to a light detector. A normalized intensity signal, equal to the quotient of the difference and the sum of the two intensity signals, is formed by an analyzer circuit from the two electrical intensity signals, formed by the light detector, corresponding to the sub-beam signals. The second magneto-optical current converter, provided for protection purposes, also comprises a light source, a polarizer, a fiber surrounding the conductor in the form of a measuring coil, and an analyzer circuit. Contrary to the first current converter provided for measuring purposes, the second urrent converter is of the transmission type, i.e., the light from the light source, linearly polarized in the polarizer, is injected into the measuring coil at one end, traverses the measuring coil once only, is removed from the other end of the measuring coil and supplied to the corresponding analyzer circuit. Furthermore, the measuring coil of the second current converter has only one measuring spire for adjustment to the overcurrent measuring range. The optical fiber is twisted in one direction of rotation along one half of the measuring spire and in the opposite direction of rotation in the other half of the spire to suppress its intrinsic circular birefringence (double-twisted fiber). In this known arrangement, each of the two current converters requires its own transmitter unit consisting of a light source and a polarizer for transmitting linearly polarized light.

SUMMARY OF THE INVENTION

The object of this invention is to provide a specific method and a specific device for measuring currents of at least two measuring ranges in a conductor, using the Faraday effect, wherein only one light source is required for transmitting measuring light.

This object is achieved according to this invention with the features of claim 1 and claim 4.

The invention is based on the principle of arranging at least two Faraday elements exhibiting the Faraday effect in the inductively generated magnetic field of a current flowing in a conductor, and analyzing the polarization rotation of a linearly polarized measuring light that has traversed a first Faraday element to measure a current in a first current measuring range, as well as analyzing the polarization rotation of a linearly polarized measuring light that has traversed at least one other Faraday element to measure a current in a second current measuring range. Measuring range is defined here as a range or interval of values for an electric current over which the Faraday rotation angle produced as a function of the electrical current is a unique function of the current.

On the basis of this principle, the measuring process for measuring currents of at least two measuring ranges in a conductor with the help of at least two Faraday elements assigned to the conductor includes the following process steps:

a) the Faraday rotation of the linearly polarized measuring light that has traversed only the first Faraday element is analyzed as a measure of a current from a first measuring range;

b) the Faraday rotation of the linearly polarized measuring light that has traversed both Faraday elements at least once is analyzed as a measure of a current from a second measuring range.

According to the above-mentioned principle, at least two Faraday elements, optically connected in series via optical connection means, are assigned to the conductor in the measuring device. A first analyzer analyzes the polarization rotation of the linearly polarized light that has traversed the first Faraday element at least once as a measure for a current in a first measuring range. A second analyzer analyzes the Faraday rotation of the linearly polarized light that has traversed both Faraday elements at least once as a measure for a current in a second measuring range. Since the polarization rotation of the measuring light that has traversed two Faraday elements is greater than the polarization rotation of the measuring light that has traversed only one of the two Faraday elements for the same current in the conductor, the second analyzer can measure smaller currents than the first analyzer. With the above-mentioned measures, one light source is sufficient for transmitting the measuring light, since the measuring light can be split into two sub-beams by the optical connection means, with one of the sub-beams being received and analyzed by the first analyzer and the second sub-beam being received and analyzed by the second analyzer. In addition, the device may have a compact design, since both Faraday elements can be arranged next to one another in a space-saving manner.

Specific embodiments of the method and the device according to the invention are set forth in the dependent subclaims.

In a first embodiment, the first Faraday element is operated in a reflection device. Linearly polarized measuring light is injected into the first Faraday element by appropriate means; the measuring light traverses the first Faraday element for a first time. The optical connection means reflects back only a first component of the measuring light into the first Faraday element and allows a second component of the measuring light to pass, which is supplied to the second Faraday element. The connection means may contain a semi-transparent mirror arranged basically perpendicularly to the direction of propagation of the light for this purpose. The first component of the measuring light, reflected back, traverses the first Faraday element for a second time in the opposite direction compared to the first time and is then supplied to the first analyzer.

In a second embodiment, the first Faraday element is operated in a transmission device. In this embodiment, the linearly polarized measuring light of the injection means is split into two components by the optical connection means after traversing the first Faraday element. The first component of the measuring light is directly supplied to the analyzer without traversing the first Faraday element again. The connection means may comprise, for example, an optical fiber coupler or a beam splitter. The second component of the measuring light is injected into the second Faraday element. This second component of the measuring light can, after traversing the second Faraday element once, either A) be supplied to the second analyzer, or B) be reflected back into the second Faraday element by light reflection means, and B1) be supplied to the second analyzer after traversing the second Faraday element or B2) be supplied to the second analyzer after traversing again the two Faraday elements connected in series, or C) be split into two sub-beams, one of which traverses at least one more Faraday element at least once and is analyzed by a third analyzer for a current in a third measuring range and the other sub-beam is supplied to the second analyzer after optionally traversing at least the second Faraday element again.

In embodiment C), the second Faraday element and the additional Faraday element preferably have different measuring sensitivities.

The Faraday elements can be manufactured, in particular, with optical fiber coils or solid rings around the conductor.

BRIEF DESCRIPTION OF THE DRAWINGS

Reference is made to the drawing for further explanations to the invention.

Corresponding parts are shown with the same reference numbers.

DETAILED DESCRIPTION OF THE INVENTION

Figure 1:
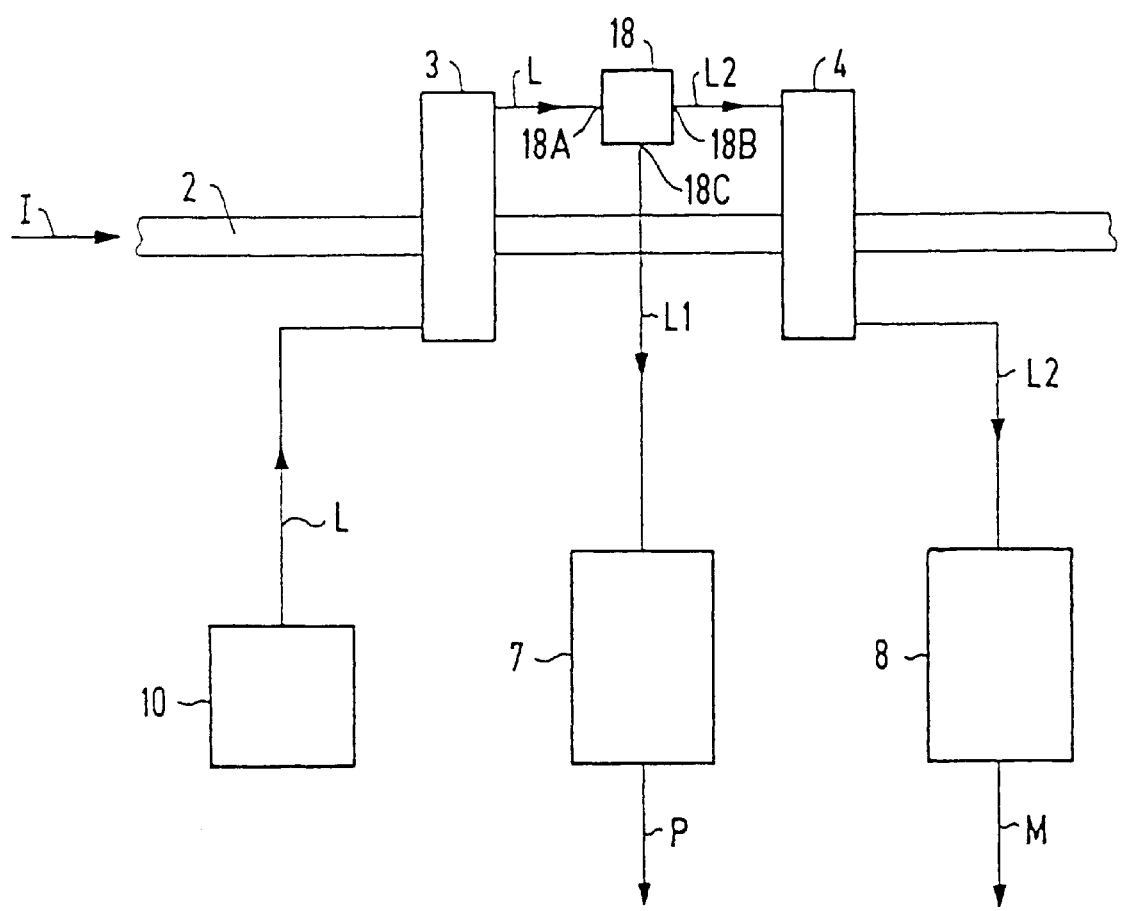
FIG. 1 schematically shows a device for measuring currents of two measuring ranges with two Faraday elements, each one operated in the transmission mode, FIG. 2 schematically shows a device for measuring currents of two measuring ranges with one Faraday element operated in the transmission mode and the second Faraday element operated in the reflection mode, FIG. 3 schematically shows a device for measuring currents of two measuring ranges with a first Faraday element operated in the transmission mode and a series circuit consisting of two Faraday elements operated in the reflection mode, connected in series, FIG. 4 schematically shows a device for measuring currents of three measuring ranges with a first Faraday element operated in the transmission mode and two series circuits, each consisting of an additional Faraday element and the first Faraday element, FIG. 5 schematically shows a device for measuring currents of three measuring ranges with a series circuit consisting of three Faraday elements, FIG. 6 schematically shows a device for measuring currents of two measuring ranges with two fiber-optic Faraday elements and separate analyzers, FIG. 7 schematically shows a device for measuring currents of two measuring ranges with a first Faraday element operated in the reflection mode and a series circuit, operated in the transmission mode, consisting of this first Faraday element and a second Faraday element, FIGS. 8 and 9 schematically show two devices for measuring currents of two measuring ranges with separate analyzers, and FIG. 10 schematically shows a device for measuring currents of three measuring ranges with a first Faraday element operated in the reflection mode and two series circuits each consisting of an additional Faraday element and the first Faraday element.

The embodiment of the device for measuring currents of two different measuring ranges, illustrated in FIG. 1, comprises two Faraday elements 3 and 4, each of which is located in the proximity of a conductor 2 to measure an electric current I in this conductor 2, using the magneto-optic Faraday effect. In general, at least one Faraday element, but preferably both Faraday elements 3 and 4, surround conductor 2, so that the light running through the Faraday element(s) goes around conductor 2 at least once along a basically closed path. The first Faraday element 3 and/or the second Faraday element 4 can have solid bodies exhibiting the Faraday effect, preferably made of glass. One or more bodies can be provided for each Faraday element 3 or 4. These bodies preferably surround conductor 2 in a closed light path. A single contiguous body is then configured as a generally polygonal ring. Such solid bodies, in particular a ring-shaped body, are mechanically sturdy and have virtually no circular birefringence. In another embodiment, the first Faraday element 3 and/or the second Faraday element 4 are made from one waveguide (each), preferably surrounding conductor 2 in the form of a measuring coil with at least one spire.

The first Faraday element 3 and the second Faraday element 4 are connected optically in series via a three-port coupler 18 used as an optical connection means. The first Faraday element 3 is connected between a transmitter 10 provided for transmitting linearly polarized measuring light L and the second Faraday element 4; it is therefore traversed first by linearly polarized measuring light L of transmitter 10. A laser diode or a light source (such as a LED) with a polarizer connected downstream can be provided as transmitter 10. Three-port coupler 18 for the optical coupling of the two Faraday elements 3 and 4 is configured so that a first component L1 of the measuring light L injected by transmitter 10 into the first Faraday element 3, which has traversed the first Faraday element 3, is injected into the first analyzer 7 and a second component L2 of the measuring light L, which has traversed first Faraday element 3, is injected into second Faraday element 4. A beam-conducting, semi-transparent mirror, arranged at an angle of generally 45° to the direction of the beam of the incident measuring light L, or a Y-coupler, in particular a waveguide coupler, can be provided as three-port coupler 18.

The second component L2 of measuring light L traverses the second Faraday element 4 once only and then is directly injected into a second analyzer 8. The second Faraday element 4 is thus operated in the transmission mode in relation to the second component L2 of the measuring light L. For this purpose, the second Faraday element 4 is optically connected to a second port 18B of three-port coupler 18 provided to inject the second component L2 into the second Faraday element 4 and to the second analyzer 8 provided to transmit the second component L2 of measuring light L transmitted through the second Faraday element 4. A first port 18A of three-port coupler 18 is optically connected to the first Faraday element 3 to transmit measuring light L that has traversed the first Faraday element 3 and a third port 18C is connected to the first analyzer 7 to transmit the first component L1 of measuring light L.

Waveguides, preferably polarization-maintaining fiber waveguides, are advantageously provided, one for transmitting the first component L1 of measuring light L from three-port coupler 18 to the first analyzer 7 and another for transmitting the second component L2 of measuring light L from the second Faraday element 4 to the second analyzer 8. The optical coupling between three-port coupler 18 and the Faraday elements 3 and 4 can also take place via a polarization-maintaining waveguide. Finally, measuring light L of transmitter 10 is preferably transmitted to the first Faraday element 3 via a polarization-maintaining waveguide.

The first analyzer 7 analyzes the Faraday rotation of the polarization plane of the first component L1 of measuring light L, producing a first measurement signal P, which can be picked up at an output of the first analyzer 7. Thus the first Faraday element 3 is operated in the transmission mode. The second analyzer 8 analyzes the Faraday rotation of the polarization plane of the second component L2 of measuring light L, producing a second measurement signal M, which can be picked up at an output of the second analyzer 8. The entire Faraday rotation of the polarization plane of the second component L2 of measuring light L consists of a first Faraday rotation component produced in the first Faraday element 3 and a second Faraday rotation component produced in the second Faraday element 4. If the Faraday rotation in both Faraday elements 3 and 4 took place in the same direction because the same direction of circulation of the transmitted light in the first Faraday element 3 and the second Faraday element 4 in relation to the direction of the current in conductor 2, then the entire rotation angle is equal to the sum of the two individual rotation angles. In the case of opposite directions of rotation, the resulting rotation angle is equal to the difference of the two individual rotation angles.

In the embodiment according to FIG. 1, the optical series circuit consisting of the two Faraday elements 3 and 4 is operated in the transmission mode in relation to the second component L2 of measuring light L.

Figure 2:
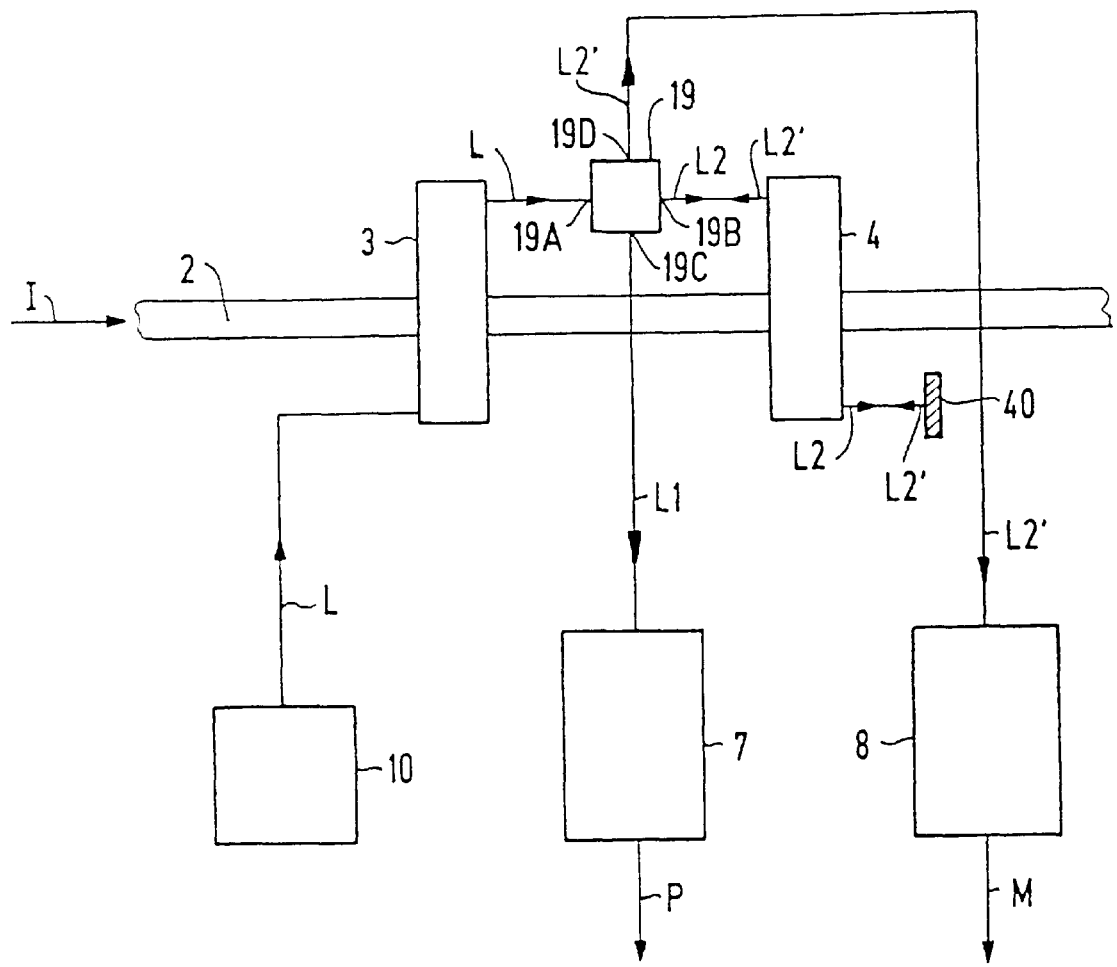

FIG. 2 illustrates another embodiment of the measuring device. The first Faraday element 3 and the second Faraday element 4 are optically connected in series via an optical four-port coupler 19 with four ports 19A through 19D as an optical connection means. The second analyzer 8 is optically connected to port 19D of four-port coupler 19. The second Faraday element 4 has a light-reflecting means 40, for example, a mirror, which reflects the second component L2 of measuring light L back into the second Faraday element 4 after it has traversed the second Faraday element 4 for the first time. The reflected second component of measuring light L is designated with L2'. This reflected second component L2' traverses the second Faraday element 4 in the opposite direction for a second time and is then supplied to the second analyzer 8 via four-port coupler 19. Port 19B, connected to the second Faraday element 4, and port 19D, connected to the second analyzer 8 of four-port coupler 19, are optically connected for this purpose. Port 19 connected to the first Faraday element 3 and port 19C connected to the first analyzer 7 of four-port coupler 19 are also optically connected. A beam splitter with a semi-transparent mirror arranged obliquely to the direction of propagation of the light or a fiber-optic coupler can be provided as a four-port coupler 19, for example. The second Faraday element 4 is thus operated in the reflection mode in this embodiment according to FIG. 2. Light component L2', analyzed by the second analyzer 8, has a Faraday rotation of its polarization plane consisting of the Faraday rotation upon traversing the first Faraday element 3 and the double Faraday rotation upon traversing the second Faraday element 4.

Figure 3:
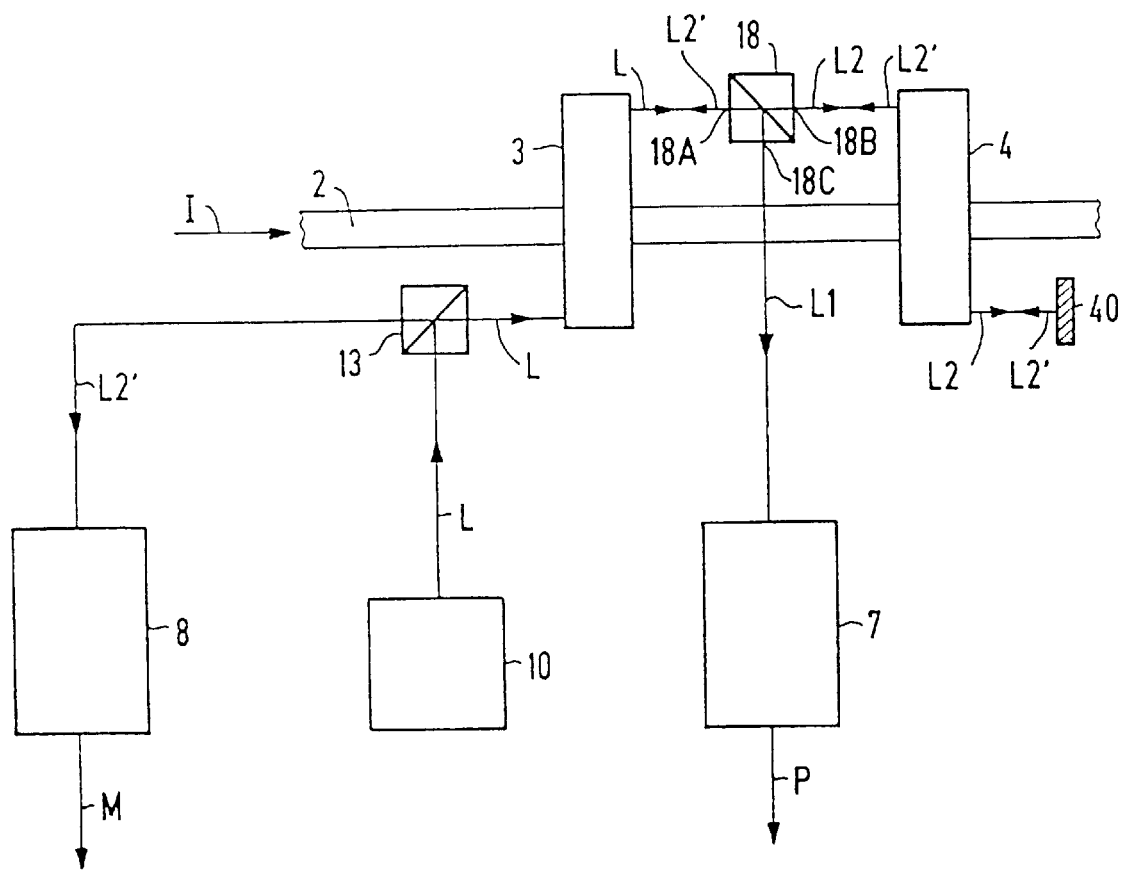

FIG. 3 shows another embodiment of the measuring device with two Faraday elements 3 and 4. Both Faraday elements 3 and 4 are optically connected via a three-port coupler 18. As in FIG. 2, the second Faraday element 4 has light-reflecting means 40, which reflect back the second component L2 of measuring light L, transmitted through second Faraday element 4 once, into second Faraday element 4. The reflected second component L2' of measuring light L traverses the second Faraday element 4 for the second time in the opposite direction and is supplied to the first Faraday element 3 via port 18B of three-port coupler 18 and port 18A. Subsequently this second component L2' of measuring light L traverses the first Faraday element 3 for the second time in the opposite direction and is supplied to second analyzer 8, preferably through another optical coupler 13. Optical coupler 13 connects the first Faraday element 3 to both transmitter 10 and second analyzer 8. The linearly polarized measuring light L transmitted by transmitter 10 is injected into the first Faraday element 3 via coupler 13. A fiber coupler or a beam splitter provided with a semi-transparent mirror can be provided as coupler 13.

Transmitter 10 can be a source of linearly polarized light, such as for example a laser diode, or a light source with a polarizer connected downstream, or, in an embodiment that is not illustrated, may consist of a light source and polarizing means arranged directly upstream from the first Faraday element 3, such as for example a polarization filter to linearly polarize the light supplied by the light source. In the above embodiment of transmitter 10, optical coupler 13 is optically connected between the light source and the polarizing means.

In all embodiments the measuring sensitivities of Faraday elements 3 and 4 are preferably chosen so that the measurement signal M is a unique measure for a current in a first, predefined measuring range and the other measurement signal P is a unique measure for a current in a second predefined measuring range. To set the two Faraday elements 3 and 4 to different sensitivities, materials with different Verdet constants are used for the two Faraday elements 3 and 4 or Faraday elements 3 and 4 with different light wavelengths are used along the magnetic field generated by current I. In a particularly advantageous embodiment, the measuring range of the first Faraday element 3 operated in the transmission mode is adjusted to a predefined overcurrent measuring range for protection purposes, typically located between 10 kA and at least 100 kA. The sufficiently high Faraday rotation angles generated by overcurrents I in this range are then analyzed by the first analyzer 7 provided to produce a measurement signal P as a protection signal. The total range of the series circuit resulting from the individual measuring ranges of the two Faraday elements 3 and 4 is adjusted to a predefined nominal current measuring range, taking into account the number of passes of the second component L2 of measuring light L through each individual Faraday element 3 and 4. The nominal current measuring range is usually less than the overcurrent measuring range by a factor of 10 to 30. The total range is a current range over which the total rotation angle of the second component L2 of measuring light L transmitted at least once by both Faraday elements 3 and 4 is a unique function of current I. The total rotation angle is analyzed by the second analyzer 8 provided to produce the second measurement signal M as a measure of a current I in the nominal measuring range. For nominal currents I, the Faraday rotation angle in the first Faraday element 3 is in general much smaller than the Faraday rotation angle in the second Faraday element 4 due to the relatively lower measurement sensitivity of the first Faraday element 3.

Figure 4:
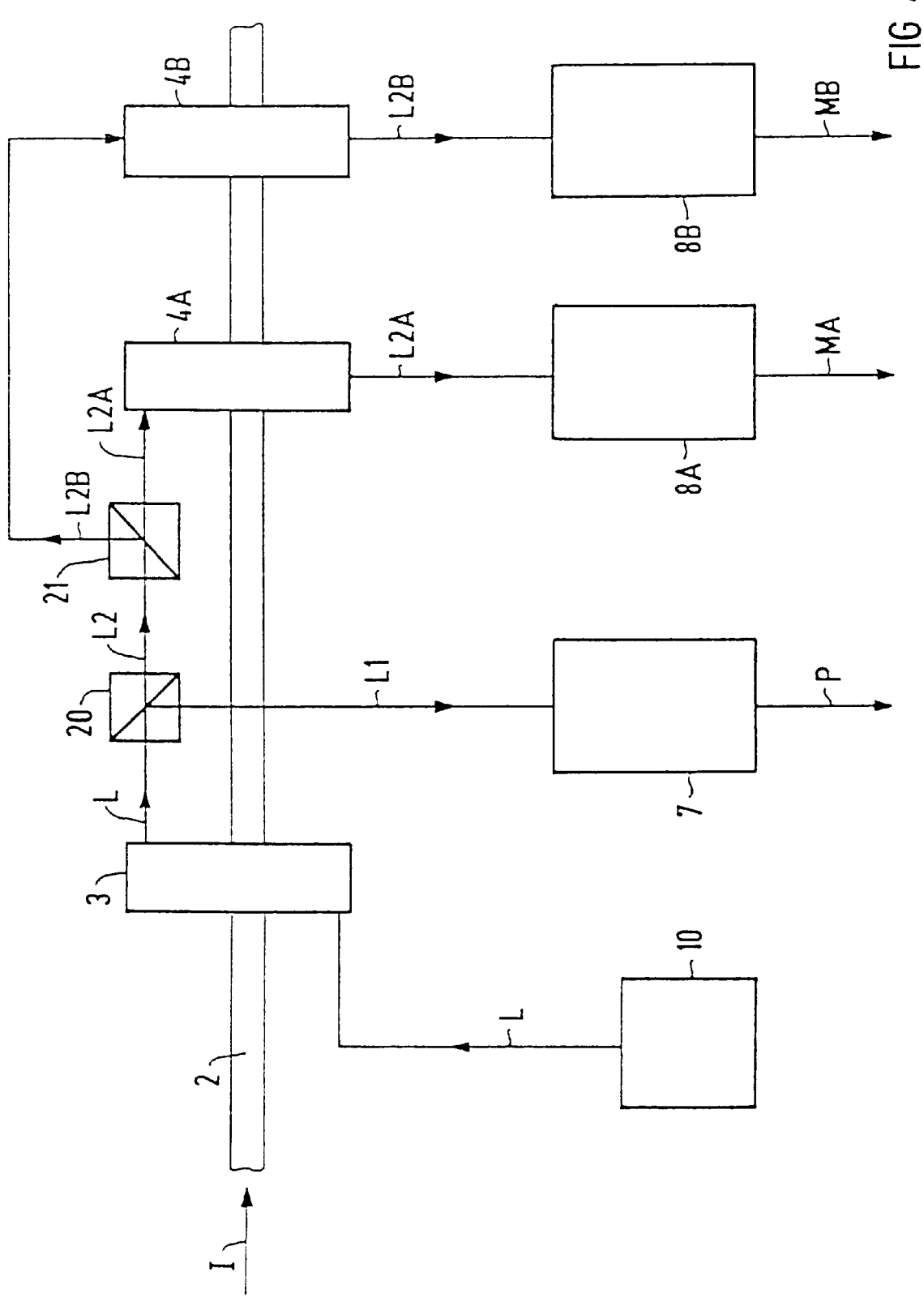

In the embodiment of the measuring device according to FIG. 4, two more Faraday elements 4A and 4B are provided in addition to the first Faraday element 3 and the corresponding first analyzer 7; each of Faraday elements 4A and 4B is optically connected in series to the first Faraday element 3 and each has an analyzer 8A and 8B, respectively. The second analyzer 8A analyzes a light component L2A of measuring light L transmitted through the series circuit consisting of the first Faraday element 3 and the second Faraday element 4A and generates a measurement signal MA, and the third analyzer 8B analyzes a component L2B, transmitted through the series circuit consisting of the first Faraday element 3 and the third Faraday element 4B, and generates a second measurement signal MB. Two beam splitters 20 and 21, optically connected in series, are used as optical connection means for connecting the first Faraday element 3 to Faraday elements 4A and 4B. The first beam splitter 20 splits the measuring light L exiting the first Faraday element 3 into a first component L1 and a second component L2. The first component L1 of measuring light L is supplied to first analyzer 7, and the second component L2 of measuring light L is supplied to the second beam splitter 21. In the second beam splitter 21, this second component L2 is split into two components L2A and L2B. The first component L2A is then injected into second Faraday element 4A and after traversing this second Faraday element 4A, is supplied to the first additional analyzer 8A. The second light component L2B is injected into the third Faraday element 4B and, after traversing this third Faraday element 4B, it is supplied to second additional analyzer 8B, where it is analyzed. Therefore the optical connection means split measuring light L into three components L1, L2A, and L2B, and inject the first component L1 into the first analyzer 7, the second component L2A into the second Faraday element 4A, and the third component L2B into the third Faraday element 4B. Optical connection means may comprise optical Y-couplers or multiple splices. The different Faraday rotations of each of these light components L1, L2A, and L2B are analyzed by analyzers 7, 8A, and 8B, respectively, which generate measurement signals P, MA, and MB, respectively, for a current in the corresponding measuring range. By suitably selecting the measuring sensitivities of the two additional Faraday elements 4A and 4B, currents of three different measuring ranges can be measured with this embodiment.

More than two additional Faraday elements, each connected in series with the first Faraday element 3, can also be provided.

Figure 5:
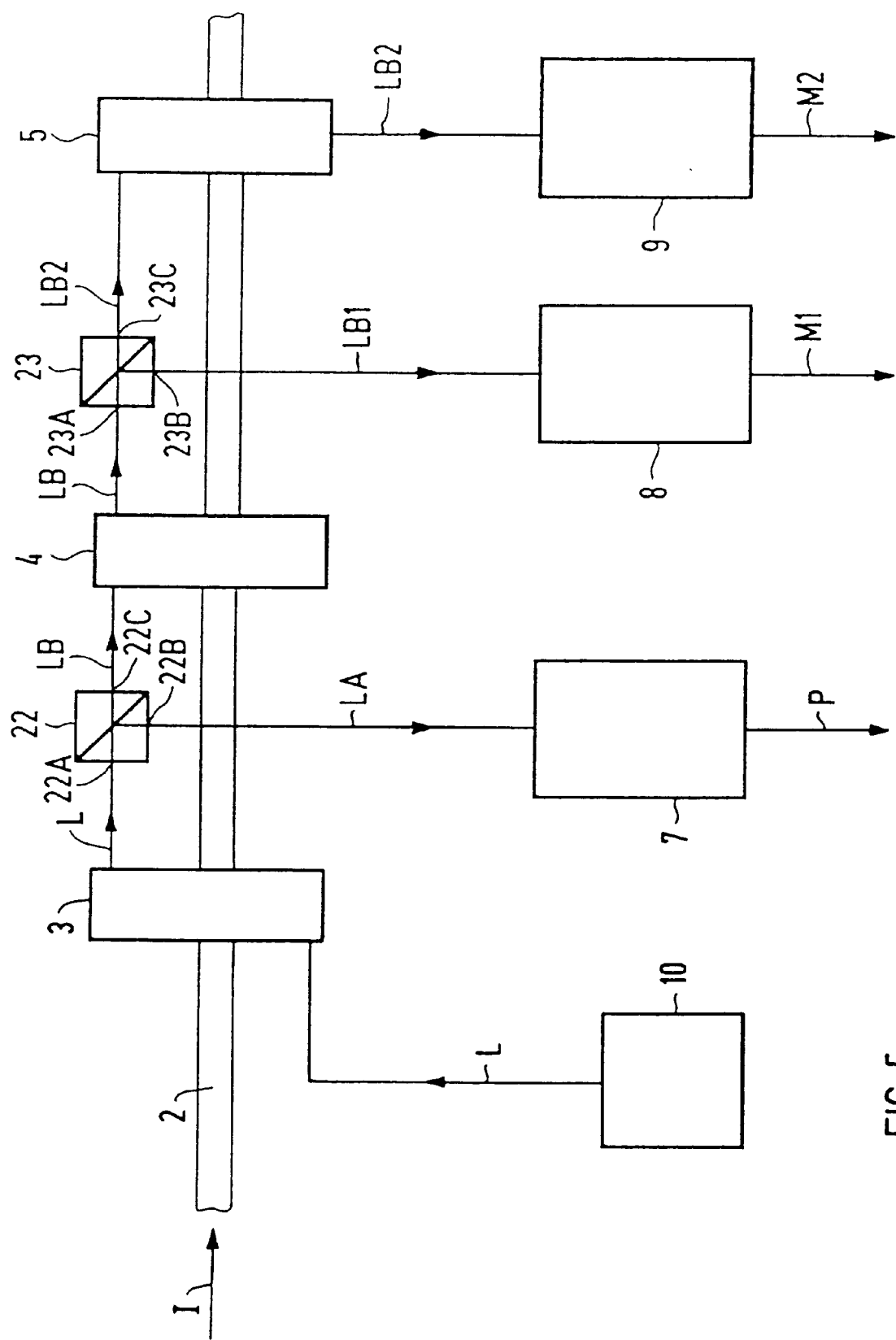

FIG. 5 shows an embodiment of the device with three Faraday elements 3, 4, and 5 for measuring electric currents I of three measuring ranges. The three Faraday elements 3, 4, and 5 are optically connected in series. The first Faraday element 3 is optically coupled to the second Faraday element 4 via a three-port coupler 22, for example, a beam splitter, and to the first analyzer 7. The second Faraday element 4 is optically coupled to the third Faraday element 5 via another three-port coupler 23 and to a second analyzer 8. Linearly polarized measuring light L of transmitter 10 traverses the first Faraday element 3 and is supplied to a port 22A of three-port coupler 22. Three-port coupler 22 splits the measuring light L into a first component LA, which is supplied through a second port 22B of three-port coupler 22 to the first analyzer 7, and a second component LB, which is supplied to the second Faraday element 4 via a third port 22C of three-port coupler 22. After also traversing the second Faraday element 4, the second component LB is supplied to a first port 23A of an additional three-port coupler 23 and split by the additional three-port coupler 23 into a component LB1 and a component LB2. Component LB1 is supplied from a port 25B of three-port coupler 22 to second analyzer 8. Component LB2 exits from another port 23C of three-port coupler 23, traverses the third Faraday element 5 and is then supplied to the third analyzer 9. The first analyzer 7 derives a measurement signal P for a current I of the first measuring range from component LA of measuring light L after its transmission through the first Faraday element 3. The second analyzer 8 derives a measurement signal M1 for a current I of the second measuring range from measuring light component LB1 that has traversed the series circuit consisting of the first Faraday element 3 and the second Faraday element 4. The third analyzer 9 finally derives a measurement signal M2 as a measure of a current I of a third measuring range from component LB2 that has traversed the series circuit cnsisting of all three Faraday elements 3, 4, 5. The three current measuring ranges can be adjusted in particular by selecting the appropriate measuring sensitivities of Faraday elements 3, 4, and 5.

In principle any analog or digital analysis method can be used for analyzing the Faraday rotation angle in the first analyzer 7 and the additional analyzers 8, 8A, 8B or 9 and determining the polarization status of the linearly polarized light.

Figure 6:
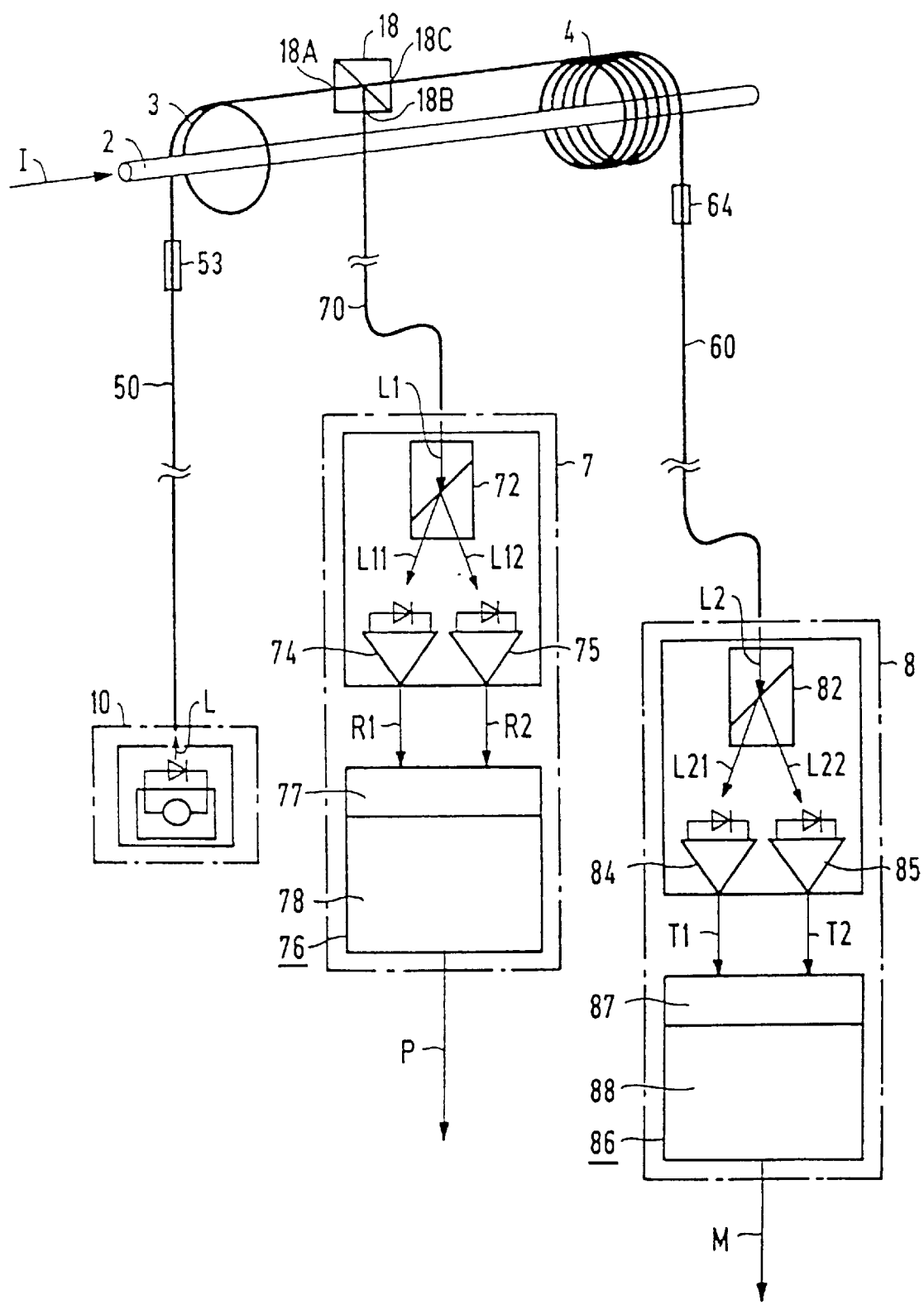

FIG. 6 shows an embodiment with two Faraday elements designed as fiber coils connected in parallel and with advantageous analyzers. An optical fiber surrounding conductor 2 in the form of a measuring coil is provided for both the first Faraday element 3 and the second Faraday element 4. Preferably annealed optical fibers are provided, which are distinguished by their low linear birefringence and virtually negligible circular birefringence. In this embodiment, the number of spires of the measuring coils can also be varied in addition to the selection of different materials for the two Faraday elements 3 and 4 to adjust the measuring ranges. The measuring coil of the second Faraday element 4 has preferably more spires than the coil of the first Faraday element 3. Thus the measuring range of the second Faraday element 4, considered individually, encompasses smaller currents I than the measuring range of the first Faraday element 3, considered individually, for comparable Faraday rotation of the fiber materials of both Faraday elements 3 and 4. In the embodiment illustrated, the total range for the series circuit consisting of both Faraday elements 3 and 4 is adjusted through the sum of spires of the two measuring coils of the first Faraday element 3 and the second Faraday element 4 with the two coils having the same direction of circulation. Transmitter 10 generates linearly polarized measuring light L, which is injected into the first Faraday element 3 via a polarization-maintaining waveguide 50 serving as a transmission path. A low-birefringence optical fiber (LoBi fiber) can be used as polarization-maintaining waveguide 50. A splice 53 preferably connects waveguide 50 to the measuring coil of the first Faraday element 3. The second Faraday element 4 and the second analyzer 8 are preferably also optically connected via a polarization-maintaining waveguide 60. This waveguide 60 can also be connected to the measuring coil of the second Faraday element 4 via a splice 64 and/or designed as a LoBi fiber. The two Farada elements 3 and 4 are preferably connected in series via a beam-splitter splice used as a three-port coupler 18 and are operated in the transmission mode as in the embodiment of FIG. 1. Faraday elements 3 and 4 can, however, also be operated as in the embodiments of FIGS. 2 or 3.

FIG. 6 further illustrates advantageous embodiments of the two analyzers 7 and 8. In the first analyzer 7, there are provided means 72 for splitting the first component L1 of measuring light L that has traversed the first Faraday element 3 into two linearly polarized partial beam signals L11 and L12 with different polarization planes, optically coupled, preferably through a polarization-maintaining waveguide 70, to a port 18B of three-port coupler 18. Furthermore, this analyzer 7 comprises photoelectric converters 74 and 75 for converting the sub-beam signals L11 and L12 into electric signals R1 and R2, respectively, as measures for the intensity of sub-beam signals L11 and L12, as well as electronic means 76 for deriving measurement signal P from these two electric signals R1 and R2. A polarizing beam splitter, preferably a Wollaston prism, or a beam splitter and two analyzers connected optically downstream, intersecting at a given angle, can be provided as means 72 for splitting measuring light component L1 into two sub-beam signals L11 and L12. Sub-beam signals L11 and L12 can be transmitted in a free-beam device or via waveguides to converters 74 and 75. Each output of photoelectric converters 74 and 75 is electrically connected to an input of electronic means 76. Electronic means 76 contains, in a preferred embodiment, an analog-digital converter 77 to digitize both signals R1 and R2 and a downstream digital computing unit 78 for calculating measurement signal P as a measure of a current in a first measuring range in conductor 2. Preferably a quotient signal $(R1-R2)/(R1+R2)$ of the difference $(R1-R2)$ and sum $(R1+R2)$ of the two electric signals R1 and R2 is calculated first in computing unit 78. This quotient signal is largely cleansed of the intensity fluctuations of transmitter 10 or in the transmission path and is proportional to $\cos(2\alpha)$, where $\alpha$ is the Faraday rotation angle. A measurement signal P as a direct measure of current I in conductor 2 is then obtained from the relationship $P=\alpha/(N_S*V_S)$, where $N_S$ is the number of spires of the first Faraday element 3 and $V_S$ is the Verdet constant of the material of the first Faraday element 3. Typically $N_S$ is between 1 and 3 for overcurrent measurement.

The second analyzer 8 has a design similar to that of first analyzer 7. Means 82, preferably a Wollaston prism, is provided for splitting the linearly polarized component L2, transmitted through the second Faraday element 4 into two linearly polarized sub-beams L21 and L22 with different polarization planes, optically connected to the second Faraday element 4 via a polarization-maintaining waveguide 60. Waveguide 60 is connected to the fiber of the second Faraday element 4 via a splice 64. An optical fiber with high linear birefringence (HiBi fiber) can be used, in particular, as polarization-maintaining waveguide 60, whose natural linear birefringence axes are adjusted to the natural axes of Wollaston prism 82. Furthermore, the second analyzer comprises photoelectric converters 84 and 85 for converting these sub-beam signals L21 and L22 into electric signals T1 and T2, respectively, as measures of the intensity of the sub-beam signals L21 and L22, respectively, and electronic means 86 for deriving measurement signal M from the two electric signals T1 and T2. Electric signals T1 and T2, corresponding to the light intensities of sub-beam signals L21 and L22, at the outputs of converter 84 and 85 are supplied again to an analog/digital converter 87 and a downstream digital computing unit 88 by electronic means 86. Preferably a normalized intensity quotient signal (T1−T2)/(T1+T2) is derived first from the difference T1−T2 and the sum T1+T2 of the two electric signals T1 and T2 in computing unit 88. This quotient signal is proportional to cos (2β) where β is the total Faraday angle of the transmitted polarized light component LT. The measurement signal M corresponding to a current I in conductor 2, preferably of the nominal current range is then obtained from the relationship $M=\beta/(N_S*V_S+N_M*V_M)$ with the number of spires $N_M$ and the Verdet constant $V_M$ of the second Faraday element 4 is usually selected to be between 10 and 50.

In addition, a temperature compensation procedure can be performed due to the high measurement accuracy required, especially for nominal currents.

The interval [−Π/4; +Π/4] is usually selected as the range of values for the Faraday rotation angle α as a function of the current in the first measuring range (overcurrent), and the total Faraday rotation angle β as a function of a current in the second measuring range (nominal current). Rotation angles α and β are then unique functions where a value from the measuring range (a current) is reflected in a value from the range of values (a rotation angle).

Figure 7:
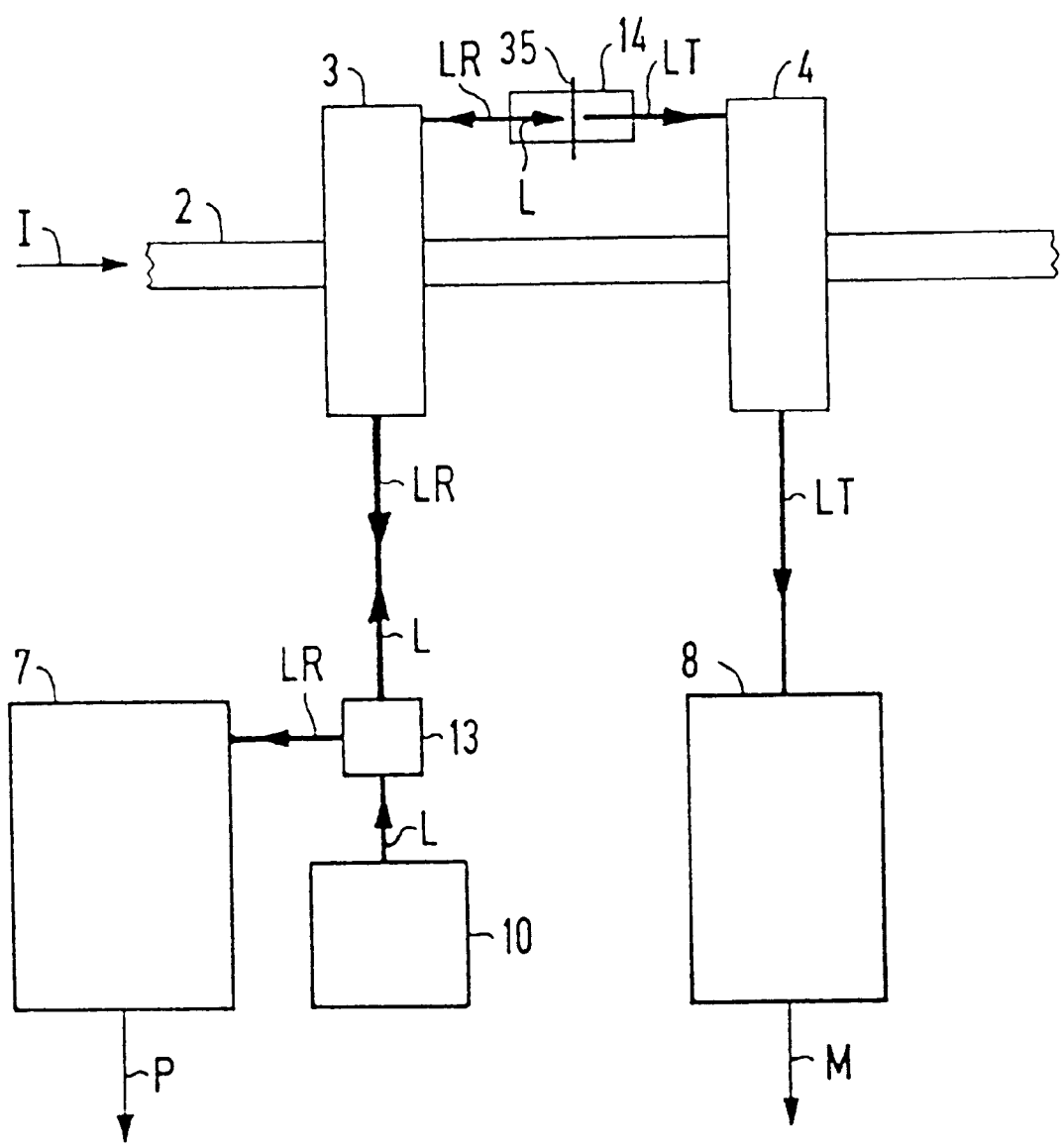

In the embodiment according to FIG. 7, a first Faraday element 3 and a second Faraday element 4 are arranged in the magnetic field of an electric current I in a conductor 2 and optically connected in series via optical connecting means 14. The series circuit consisting of first Faraday element 3 and second Faraday element 4 is optically connected between transmitter 10 and the second analyzer 8. The first Faraday element 3 is connected between transmitter 10 and the second Faraday element 4 and is therefore traversed first by linearly polarized measuring light L of transmitter 10. An optical coupler 13 connects the first Faraday element 3 with both a transmitter 10 for transmitting linearly polarized measuring light L and with a first analyzer 7. This coupler 13 can be a Y fiber coupler or also a beam splitter made with a semi-transparent mirror.

Optical connecting means 14 for optically coupling the two Faraday elements 3 and 4 are designed so that a portion LR of measuring light L that has traversed the first Faraday element 3 is reflected back into the first Faraday element 3 and another portion LT is transmitted and injected into the second Faraday element 4. For this purpose, optical connection means 14 preferably contain a semi-transparent mirror 35, which is arranged basically perpendicularly to the direction of the incident light beam L. However, a beam splitter with a semi-transparent mirror arranged at an angle of for example 45° to the direction of the incident light beam L and another mirror arranged in the beam path of measuring light component LR reflected on this semi-transparent mirror for reflecting back this measuring light component LR to the semi-transparent mirror, can also be provided. The light component LR, reflected back by optical connection means 14, traverses the first Faraday element 3 in the opposite direction for a second time and is supplied to the first analyzer 7 via optical coupler 13. The first Faraday element 3 is thus operated in the reflection mode. This has the advantage that, due to the non-reciprocity of the Faraday effect, measuring light LR is subjected to a Faraday rotation, which is twice as great as it is when the first Faraday element 3 is only traversed once; on the other hand, the effects of a possible circular birefringence in the first Faraday element 3 mutually cancel one another due to their reciprocity. Analyzer 7 derives a first measurement signal P from the measuring light component LR that has traversed the first Faraday element 3 twice. On the other hand, component LT of measuring light L, which has passed through optical connection means 14, traverses, after the first Faraday element 3, also the second Faraday element 4 and is supplied to second analyzer 8 after traversing the second Faraday element 4. The series circuit consisting of first Faraday element 3 and second Faraday element 4 is thus operated in the transmission mode for the transmitted component LT of measuring light L. Linearly polarized light component LT arriving at analyzer 8 has a polarization plane that has been rotated both in the first Faraday element 3 by a first Faraday rotation angle, and in the second Faraday element 4 by a second Faraday rotation angle. If the Faraday rotation in the two Faraday elements 3 and 4 took place in the same direction because of the same direction of circulation of the transmitted light in first Faraday element 3 and second Faraday element 4, then the total rotation angle s equal to the sum of the two individual rotation angles. In the event of opposite directions of rotation, the resulting rotation angle is equal to the difference of the two individual rotation angles. The resulting total rotation angle is analyzed in analyzer 8 and a second measurement signal M is generated. The measuring sensitivities of the two Faraday elements 3 and 4 are adjusted so that measurement signal M is a unique measure for currents of a first measuring range, in particular nominal currents, and the second measurement signal P is a unique measure for currents of a second measuring range, in particular overcurrents.

Figure 8:
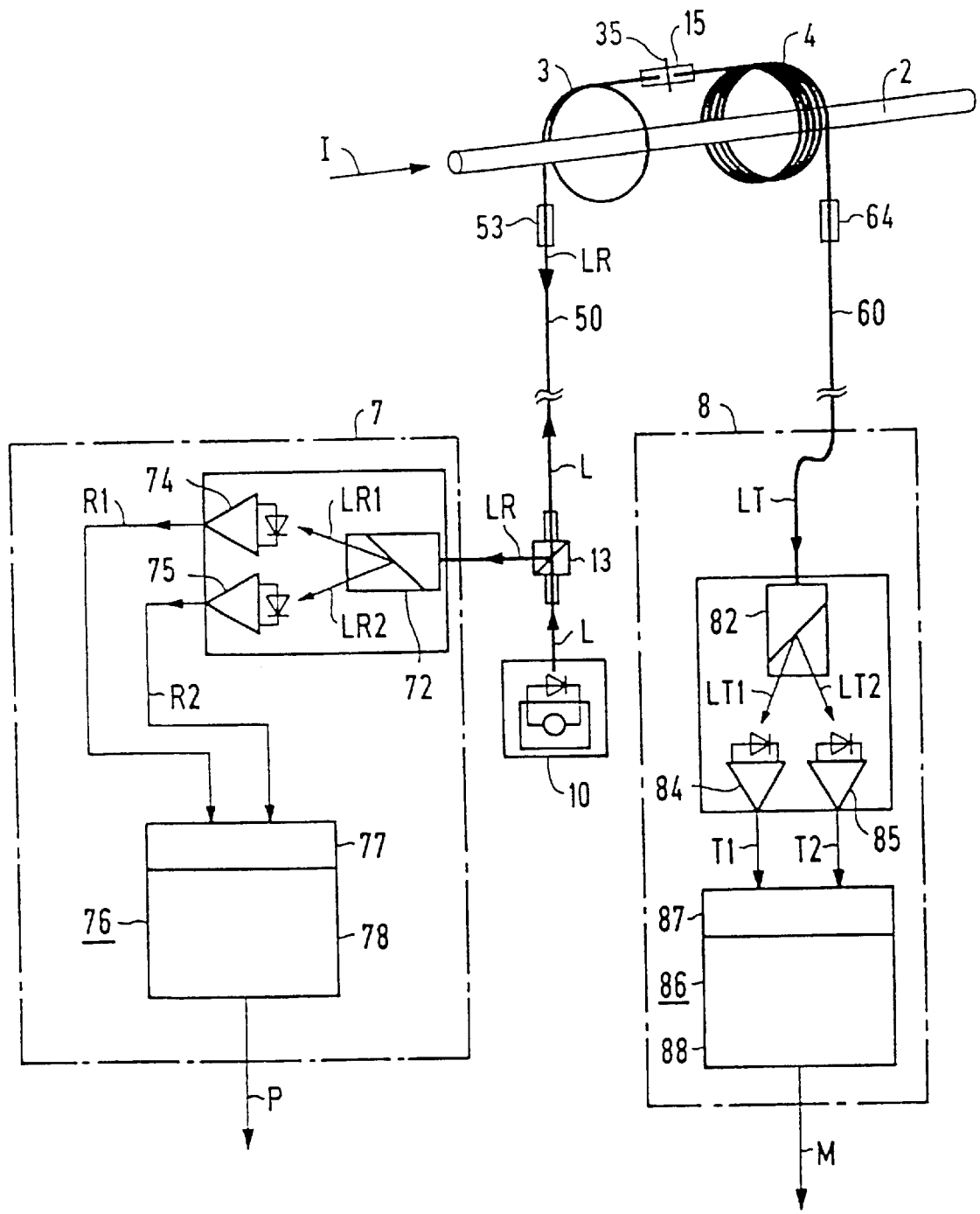

FIG. 8 shows an advantageous embodiment of the measuring device. As in FIG. 6, an optical waveguide in the form of a measuring coil, preferably an optical fiber surrounding conductor 2, is provided for both first Faraday element 3 and second Faraday element 4. Annealed fibers, which are distinguished by their low intrinsic linear birefringence and virtually negligible intrinsic circular birefringence, are preferably provided. The two Faraday elements 3 and 4 are connected in series via optical connection means 15. Optical connection means 15 is partially reflective and preferably comprises a semi-transparent mirror 35 at the end of one of the two fibers of first Faraday element 3 or second Faraday element 4, which may be applied onto the fiber end by sputtering or chemical deposition, and mechanical connecting means for connecting the fiber end provided with the mirror to the adjacent fiber end of the other Faraday element. The mechanical connection means can be a detachable plug-in connection or a non-detachable splice, for example, a capillary tube by Nippon Electric Glass. Transmitter 10 generates linearly polarized measuring light L, which is injected into the first Faraday element 3 via coupler 13 and its polarization-maintaining waveguide 50 serving as a transmission path between coupler 13 and Faraday element 3. A laser diode can be provided as transmitter 10. The beam splitter provided here as coupler 13 preferably has collimator lenses (GRIN lenses) for collimating measuring light L coming from transmitter 10 and measuring light L entering from coupler 13 into waveguide 5. A low-birefringent optical fiber (LoBi fiber) can be provided as polarization-maintaining waveguide 50. A splice 53 preferably connects waveguide 5 to the measuring coil of the first Faraday element 3. The second Faraday element 4 and the second analyzer 8 are preferably also optically connected via a polarization-maintaining waveguide 60. This waveguide 60 can also be connected to the measuring coil f the second Faraday element 4 via a splice 64 and/or designed as LoBi fiber.

The two analyzers 7 and 8 have a design similar to those of FIG. 6. Means 72 for splitting the reflected light component LR, which has twice traversed the first Faraday element 3, into two linearly polarized light signals LR1 and LR2 with different polarization planes, optically coupled with coupler 13, for example, via a free-beam device or with a waveguide, photoelectric converters 74 and 75 for converting these component light signals LR1 and LR2 into electric signals R1 and R2, respectively, as a measure of the intensity of the component light signals LR1 and LR2, as well as electronic means 76 for deriving the measurement signal P from these two electric signals R1 and R2 are provided in first analyzer 7. The outputs of photoelectric converters 74 and 75 are electrically connected to corresponding inputs of electronic means 76. Electronic means 76 comprises, in a preferred embodiment, an analog-digital converter 77 for digitizing the two signals R1 and R2, and a downstream digital computing unit 78 for calculating measurement signals P as measures for preferably an overcurrent in conductor 2. Preferably a quotient signal (R1–R2)/(R1+R2) is calculated first from the difference R1–R2 and the sum R1+R2 of the two electric signals R1 and R2. This quotient signal is largely cleansed of the intensity fluctuations of transmitter 10 or in the transmission path and is proportional to cos (2α), where α is the Faraday rotation angle. A measurement signal P as a direct measure of current I in conductor 2 is then obtained from the relationship P=α/(2$N_S$*$V_S$), where $N_S$ is the number of spires of the first Faraday element 3 and $V_S$ is the Verdet constant of the material of the first Faraday element 3. Typically $N_S$ is between 1 and 3 for overcurrent measurement.

The second analyzer 8 contains means 82 for splitting the linearly polarized transmitted light component LT into two linearly polarized sub-beam signals LT1 and LT2 with different polarization planes, optically connected to the second Faraday element 4 via polarization-maintaining waveguide 60, photoelectric converters 84 and 85 for converting these sub-beam signals LT1 and LT2 into electric signals T1 and T2, respectively, as measures for the intensity of the respective sub-beam signals LT1 and LT2, and electronic means 86 for deriving measurement signal M from the two electric signals T1 and T2. Electric signals T1 and T2 at the outputs of converters 84 and 85 are supplied again to an analog-digital converter 87 and a downstream digital computing unit 88. Preferably a normalized intensity quotient signal (T1–T2)/(T1+T2) of the difference (T1–T2) and sum (T1+T2) of the two electric signals T1 and T2 is calculated first in computing unit 88. This quotient signal is proportional to cos (2β), where β is the total Faraday rotation angle of the transmitted polarized light component LT. A measurement signal M corresponding to a current I in conductor 2 is then obtained from the relationship M=β/($N_S$*$V_S$+$N_M$*$V_M$), where $N_M$ is the number of spires and $V_S$ is the Verdet constant of the second Faraday element 4. Typically $N_M$ of the second Faraday element 4 is chosen to be between 10 and 50 for overcurrent measurement.

In addition, a temperature compensation procedure can be performed due to the high measurement accuracy required for nominal currents.

Figure 9:
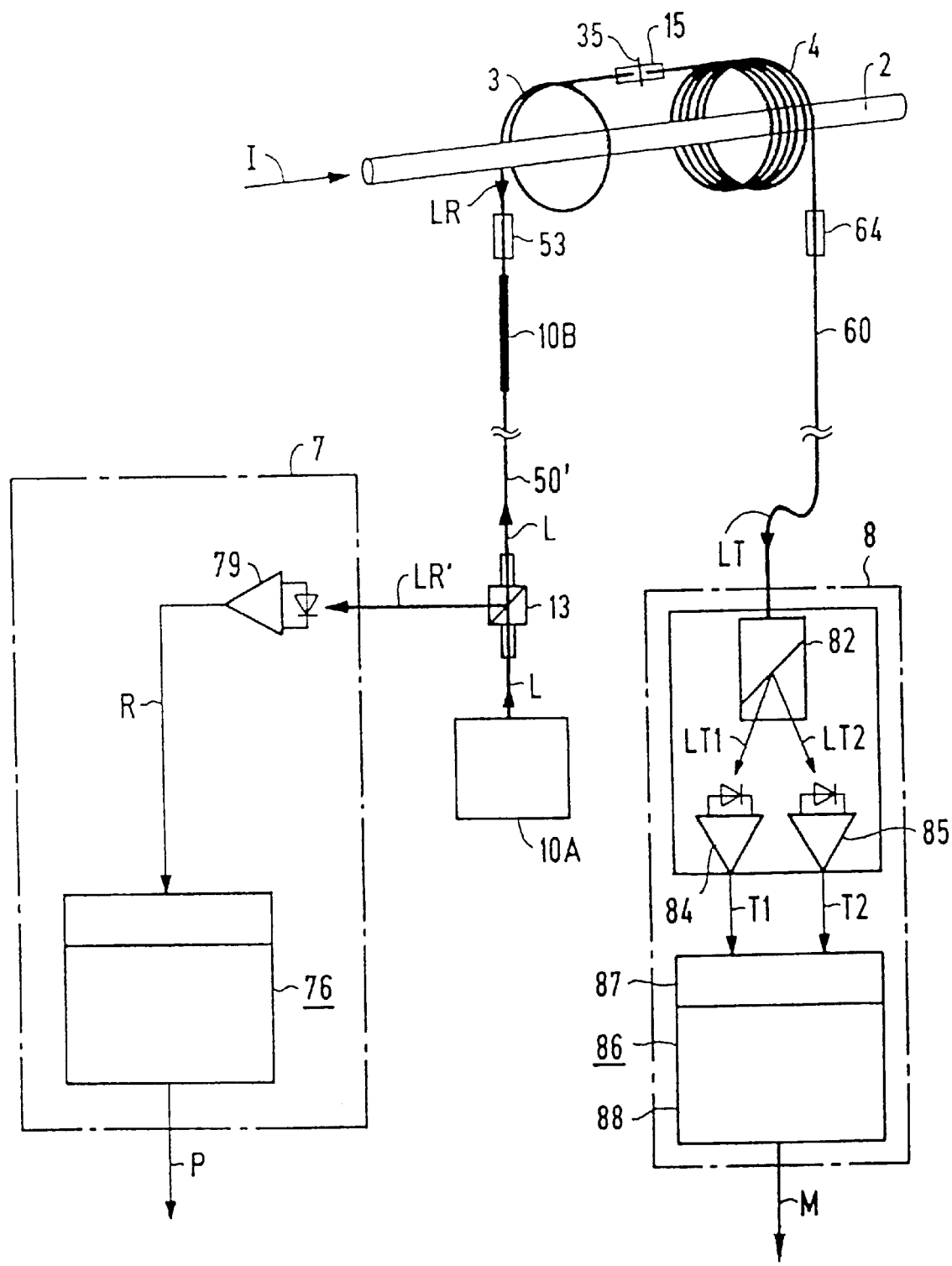

An embodiment of the device with simplified signal analysis for overcurrent measurement is shown in FIG. 9. Analyzer 7 contains here polarizing means 10B, which are optically connected between the first Faraday element 3 and coupler 13, and a photodetector 79 optically coupled with coupler 13 and whose output is electrically connected to the electronic analyzing means 76, instead of splitting means 72 as shown for the embodiment illustrated in FIG. 8. A light source 10A is provided for transmitting light L, which is optically coupled with coupler 13. Coupler 13 can be connected to polarizing means 10B via an optical fiber 50'. In this embodiment, this fiber 50' can be a simple telecommunication fiber without polarization-maintaining characteristics, since polarizing means 10B does not polarize the light L at the input of the first Faraday element 3 until immediately before light L enters the series circuit consisting of the two Faraday elements 3 and 4. Therefore a non-polarizing simple light source can also be provided as light source 10A. Polarizing means 10B and light source 10A together form transmitter 10 for injecting linearly polarized measuring light L into the first Faraday element 3. Polarizing means 10B is also provided as an analyzer for light component LR reflected by partially reflective connection means 15 and rotated in its polarization plane. The analyzer only allows component LR', projected in its predefined polarization plane of linearly polarized light LR, to pass. Linearly polarized light component LR', having traversed the analyzer, is supplied to photodetector 79 via coupler 13 and there converted into electric measurement signal R. This measurement signal R is proportional to cos (α), where α is the Faraday rotation angle. Analyzing means 76 derive from this signal R a protection signal P as a measure for an overcurrent in conductor 2 according to the relationship P= =α/(2$N_S$*$V_S$). Otherwise, the measuring device of FIG. 5 is designed as the embodiment of FIG. 8.

Figure 10:
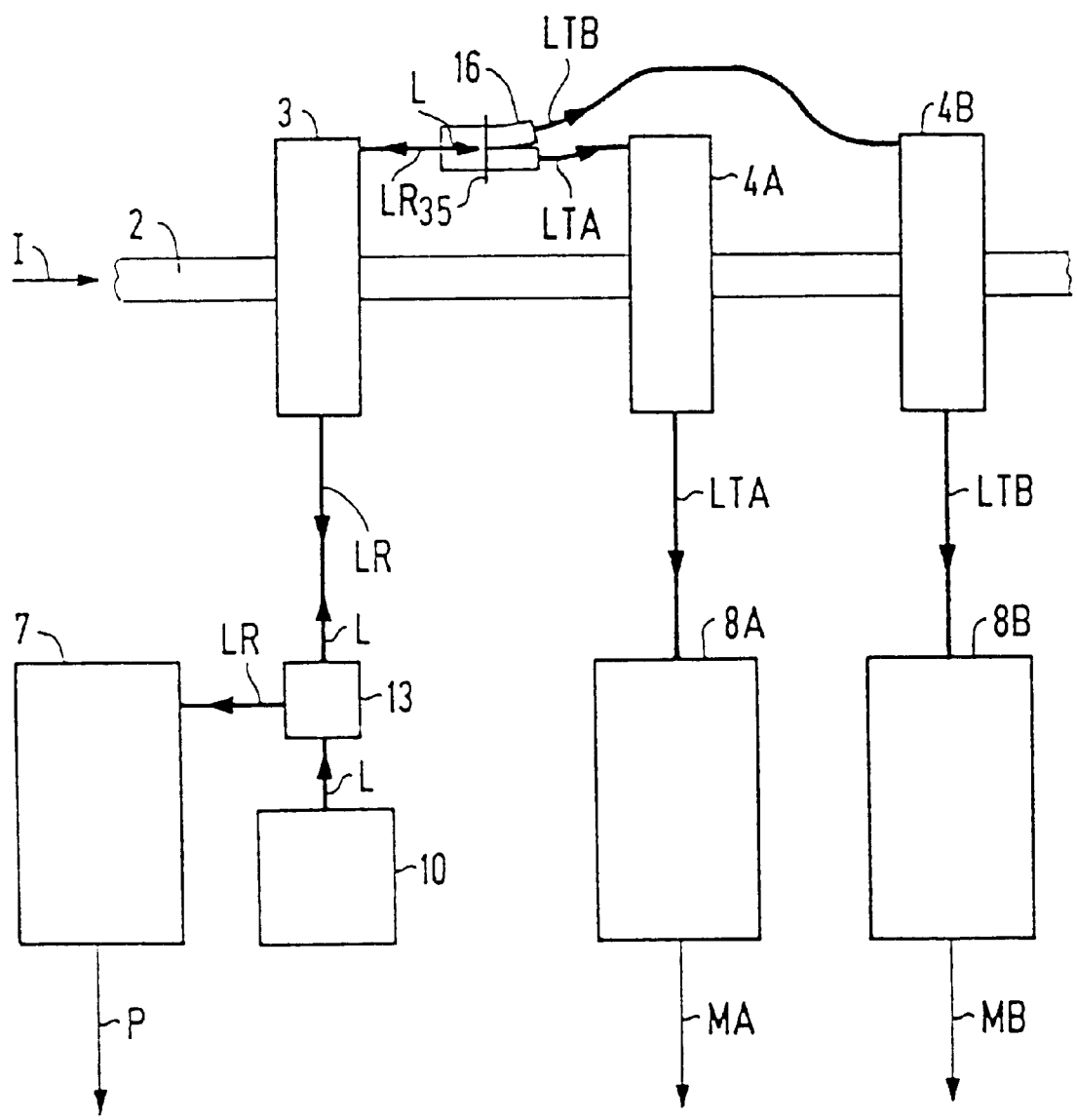

In the embodiment of the measuring device according to FIG. 10, a first Faraday element 3 and two other Faraday elements 4A and 4B are provided, which are both connected in series via common optical connection means 16 with first Faraday element 3 and each having an analyzer 8A and 8B, respectively. A partially reflective Y-coupler is preferably provided as optical connection means 16. Analyzer 8A analyzes light component LTA transmitted through the series circuit consisting of the first Faraday element 3 and the first additional Faraday element 4A, producing a measurement signal MA, and analyzer 8B analyzes light component LTB transmitted through the series circuit consisting of the first Faraday element 3 and the additional second Faraday element 4B, producing a measurement signal MB. By suitably selecting the measuring sensitivities of the individual additional Faraday elements 4A and 4B, the total range of this embodiment of the device can be extended, in particular, to nominal currents.

More than two Faraday elements each connected in series with the first Faraday element 3 via common optical connection means can also be provided. The optical connection means can then consist of, for example, a mechanical multiple splice and a mirror-coated end of the fiber of the first Faraday element.

The optical coupling of the different optical components of the measuring device is preferably supported by collimator lenses (GRIN lenses) to bundle measuring light L and its components LR, LT, LTA, and LTB.

In a special embodiment, not illustrated, a plurality of linearly polarized measuring light signals of different and normally proximate wavelengths, in combination with wavelength-sensitive optical connection means 14, 15, 16,

18, 19, 20, 22, or 23 can also be used. This prevents crosstalk between the protection channel and the measuring channel.

What is claimed is:

1. A method for measuring electric currents of at least two measuring ranges in a conductor using at least two Faraday elements assigned to the conductor, comprising the steps of:

a) causing linearly polarized measuring light to traverse a first Faraday element and after traversing the first Faraday element splitting the light into at least two components, b) analyzing the Faraday rotation of the first of at least two components of the measuring light that has traversed the first Faraday element at least once as the measure of a current in a first measuring range, and c) analyzing the Faraday rotation of a second of at least two components of the measuring light that has traversed the first Faraday element and at least one second Faraday element at least once each as the measure of a current in a second measuring range.

2. The method according to claim 1, further comprising the step of analyzing the Faraday rotation of a third component of the measuring light, that has traversed the first Faraday element and a third Faraday element at least once each as the measure of a current in a third measuring range.

3. The method according to claim 1, further comprising the step of analyzing the Faraday rotation of a third component of the measuring light L, which has traversed the first Faraday element, the second Faraday element and a third Faraday element at least once each as the measure of a current in a third measuring range.

4. An apparatus for measuring electric currents of at least two measuring ranges in a conductor comprising:

a) at least two Faraday elements assigned to the conductor;

b) means for injecting linearly polarized measuring light into a first Faraday element;

c) optical connection means through which the first Faraday element is optically connected in series with a second Faraday element and which splits the measuring light into a first component and at least one other component;

d) a first analyzer for analyzing the Faraday rotation of the polarization plane of the component of a linearly polarized measuring light that has traversed a first Faraday element at least once as the measure of a current in a first measuring range; and e) an analyzer for analyzing the Faraday rotation of the polarization plane of the other component of the measuring light, that has traversed the first Faraday element and at least one additional Faraday element at least once as the measure of a current in an additional measuring range.

5. The apparatus according to claim 4, wherein a) the optical connection means reflect back into first Faraday element the first component of the measuring light after it has traversed the first Faraday element for the first time and inject a second component into the second Faraday element, and b) the first analyzer analyzes the Faraday rotation of the first component of the measuring light after it has once more traversed the first Faraday element.

6. The apparatus according to claim 5, wherein the optical connection means comprises a semi-transparent mirror, arranged perpendicularly to the direction of propagation of the measuring light.

7. The apparatus according to claim 4, wherein the optical connection means supply the first component of the measuring light after it has once traversed the first Faraday element to the first analyzer and inject a second component of the measuring light into the second Faraday element.

8. The apparatus according to claim 7, wherein the second Faraday element has light-reflecting means that reflect back the additional component of the measuring light into the second Faraday element after it has traversed the second Faraday element for the first time.

9. The apparatus according to claim 8, wherein the optical connection means optically connects the second Faraday element and a second analyzer and supply the second component of the measuring light reflected back into the second Faraday element by the light-reflecting means after it has traversed the second Faraday element again, to the second analyzer.

10. The apparatus according to claim 8, wherein a second analyzer is optically connected to the first Faraday element and analyzes the Faraday rotation of the reflected additional component of the measuring light after it has traversed both Faraday elements again.

* * * * *